(12) United States Patent
Iwami et al.

(10) Patent No.: US 8,860,038 B2
(45) Date of Patent: Oct. 14, 2014

(54) NITRIDE SEMICONDUCTOR DEVICE AND MANUFACTURING METHOD FOR THE SAME

(75) Inventors: Masayuki Iwami, Kanagawa (JP); Takuya Kokawa, Kanagawa (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 13/617,156

(22) Filed: Sep. 14, 2012

(65) Prior Publication Data

US 2013/0069076 A1    Mar. 21, 2013

(30) Foreign Application Priority Data

Sep. 20, 2011   (JP) .................................. 2011-204981

(51) Int. Cl.
| | | |
|---|---|---|
| H01L 29/15 | (2006.01) | |
| H01L 21/02 | (2006.01) | |
| H01L 31/06 | (2012.01) | |
| H01L 21/338 | (2006.01) | |
| H01L 29/778 | (2006.01) | |
| H01L 29/20 | (2006.01) | |

(52) U.S. Cl.
CPC .......... *H01L 29/7787* (2013.01); *H01L 29/155* (2013.01); *H01L 29/2003* (2013.01)
USPC .............. 257/76; 257/190; 257/201; 438/172

(58) Field of Classification Search
CPC . H01L 29/205; H01L 29/7787; H01L 29/155; H01L 29/2003
USPC ............ 257/190, 201, 76, E21.403, E29.091; 438/172
See application file for complete search history.

(56) References Cited

U.S. PATENT DOCUMENTS 7,518,154 B2    4/2009  Otsuka et al.
2001/0015446 A1*   8/2001  Inoue et al. .................... 257/192
(Continued)

FOREIGN PATENT DOCUMENTS

| JP | 200044400 A | 2/2000 |
| JP | 2005158889 A | 6/2005 |

(Continued)

OTHER PUBLICATIONS

Office Action mailed Aug. 20, 2013 corresponds to Japanese patent application No. 2011-204981.

(Continued)

*Primary Examiner* — Long K Tran
*Assistant Examiner* — Dzung Tran
(74) *Attorney, Agent, or Firm* — Lowe Hauptman & Ham, LLP (57) ABSTRACT

Provided is a nitride semiconductor device comprising a base substrate; a buffer layer formed above the base substrate; an active layer formed on the buffer layer; and at least two electrodes formed above the active layer. The buffer layer includes one or more composite layers that each have a plurality of nitride semiconductor layers with different lattice constants, and at least one of the one or more composite layers is doped with carbon atoms and oxygen atoms in at least a portion of a carrier region of the nitride semiconductor having the largest lattice constant among the plurality of nitride semiconductor layers, the carrier region being a region in which carriers are generated due to the difference in lattice constants between this nitride semiconductor layer and the nitride semiconductor layer formed directly thereon.

13 Claims, 10 Drawing Sheets

(56) References Cited

U.S. PATENT DOCUMENTS

| | | | |
|---|---|---|---|
| 2001/0023964 A1* | 9/2001 | Wu et al. | 257/368 |
| 2002/0167023 A1* | 11/2002 | Chavarkar et al. | 257/194 |
| 2005/0145874 A1 | 7/2005 | Saxler | |
| 2005/0164482 A1* | 7/2005 | Saxler | 438/604 |
| 2005/0263791 A1* | 12/2005 | Yanagihara et al. | 257/194 |
| 2006/0073621 A1* | 4/2006 | Kneissel et al. | 438/21 |
| 2006/0278892 A1* | 12/2006 | Harris et al. | 257/194 |
| 2007/0045639 A1 | 3/2007 | Kato et al. | |
| 2010/0219452 A1* | 9/2010 | Brierley | 257/194 |
| 2010/0244101 A1 | 9/2010 | Kokawa et al. | |

FOREIGN PATENT DOCUMENTS

| | | |
|---|---|---|
| JP | 2006332367 A | 12/2006 |
| JP | 200788426 A | 4/2007 |
| JP | 2007518266 A | 7/2007 |
| JP | 2008171843 A | 7/2008 |
| JP | 2008227479 A | 9/2008 |
| JP | 2009289956 A | 12/2009 |
| JP | 4525894 B2 | 8/2010 |
| JP | 2010239034 A | 10/2010 |
| JP | 201118844 A | 1/2011 |
| JP | 201177386 A | 4/2011 |
| JP | 201177400 A | 4/2011 |
| JP | 201182218 A | 4/2011 |
| JP | 201338157 A | 2/2013 |

OTHER PUBLICATIONS

Office Action mailed Feb. 12, 2014, corresponds to Japanese patent application No. 2011-204981.

* cited by examiner

NITRIDE SEMICONDUCTOR DEVICE AND MANUFACTURING METHOD FOR THE SAME

The contents of the following Japanese Patent Application are incorporated herein by reference: No. 2011-204981 filed on Sep. 20, 2011.

BACKGROUND

1. Technical Field

The present invention relates to a nitride semiconductor device and a manufacturing method thereof.

2. Related Art

A conventional nitride semiconductor device, serving as a power device having a high OFF breakdown voltage, is known. This device includes a buffer layer that decreases distortion caused by differences in thermal expansion coefficients and lattice constants between the nitride semiconductor and a substrate, as shown in Patent Documents 1 to 5, for example. The buffer layer includes repeating composite layers that each include an AlN layer and a GaN layer.

Patent Document 1: Japanese Patent Application Publication No. 2007-88426
Patent Document 2: Japanese Patent Application Publication No. 2009-289956
Patent Document 3: Japanese Patent No. 4525894
Patent Document 4: Japanese Patent Application Publication No. 2010-239034
Patent Document 5: Japanese Translation of PCT International Patent Application No. 2007-518266

However, the lattice constant difference between the AlN layer and the GaN layer causes 2-dimensional electron gas carriers to occur in the buffer layer. Therefore, a lateral leak path is formed at the interface between the AlN layer and the GaN layer, thereby increasing the leak current. To solve this, there is a method of providing an AlGaN layer between the AlN layer and the GaN layer, as shown by Patent Document 3. However, even with this configuration, the lattice constant difference between the AlN layer and the GaN layer remains unchanged, and therefore the total amount of carriers generated in the overall buffer layer does not change. Accordingly, the leak current cannot be sufficiently restricted.

Another method is to add impurities to the GaN layer in the buffer layer to increase the resistance of the GaN layer and thereby decrease the effect of the leak current caused by the buffer layer, as shown by Patent Documents 4 and 5. Known impurities are carbon and transitional metals such as iron and nickel. However, when a high concentration of impurities is added to an epitaxial layer, cracks appear in the epitaxial layer and the dislocation density increases, thereby lowering the electron mobility. Furthermore, the addition of transitional metals causes phenomena that worsen the ON resistance, such as current collapse and current slump.

SUMMARY

Therefore, it is an object of an aspect of the innovations herein to provide a nitride semiconductor device and a manufacturing method thereof, which are capable of overcoming the above drawbacks accompanying the related art. The above and other objects can be achieved by combinations described in the independent claims. According to a first aspect related to the innovations herein, provided is a nitride semiconductor device comprising a base substrate; a buffer layer formed above the base substrate; an active layer formed on the buffer layer; and at least two electrodes formed above the active layer. The buffer layer includes one or more composite layers that each have a plurality of nitride semiconductor layers with different lattice constants, and at least one of the one or more composite layers is doped with carbon atoms and oxygen atoms in at least a portion of a carrier region of the nitride semiconductor having the largest lattice constant among the plurality of nitride semiconductor layers, the carrier region being a region in which carriers are generated due to the difference in lattice constants between this nitride semiconductor layer and the nitride semiconductor layer formed directly thereon.

According to a first aspect related to the innovations herein, provided is a method for manufacturing a nitride semiconductor device, comprising forming a buffer layer above a base substrate; forming an active layer on the buffer layer; and forming at least two electrodes above the active layer. Forming the buffer layer includes layering one or more composite layers that each have a plurality of nitride semiconductor layers with different lattice constants, and doping at least one of the one or more composite layers simultaneously with carbon atoms and oxygen atoms in at least a portion of a carrier region of the nitride semiconductor having the largest lattice constant among the plurality of nitride semiconductor layers, the carrier region being a region in which carriers are generated due to the difference in lattice constants between this nitride semiconductor layer and the nitride semiconductor layer formed directly thereon.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
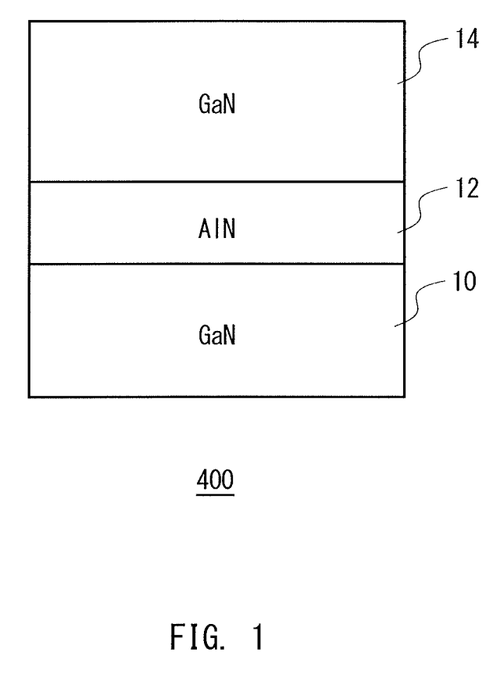
FIG. 1 is a cross-sectional view of a portion of a buffer layer that is used in a nitride semiconductor device.

FIG. 1 is a cross-sectional view of a portion of a buffer layer 400 that is used in a nitride semiconductor device. The buffer layer 400 is formed between a silicon substrate and an active layer such as a GaN layer, for example. Silicon and GaN have a lattice constant difference (approximately 17%) and a thermal expansion coefficient difference (approximately 56%), and therefore when the active layer of GaN or the like is formed directly on the silicon substrate, cracks occur in the epitaxially grown film or the substrate breaks. Therefore, the buffer layer 400, which is formed by layering a plurality of composite layers that each include repetitions of an AlN layer and a GaN layer, is provided between the GaN layer and the silicon substrate. FIG. 1 shows a GaN layer 10, an AlN layer 12, and a GaN layer 14 as a portion of the buffer layer 400.

When the AlN layer 12 is layered on the GaN layer 10, the difference in lattice constants between these layers causes 2-dimensional electron gas to be generated in the upper portion of the GaN layer 10. In an HEMT, for example, the 2-dimensional electron gas is used as a channel. However, when the thickness of the AlN layer 12 is large, distortion caused by the lattice constant difference is mitigated. When the thickness of the AlN layer 12 is large, carriers are generated in the GaN layer 10 by the lattice constant difference between the layers, but there are cases in which the carriers cannot reach a local density as high as that of the 2-dimensional electron gas. The present Specification uses the term "2-dimensional electron gas carrier" to refer to carriers generated by the difference in the lattice constants between layers, and this includes a state in which the carriers do not reach a local density as high as that of the 2-dimensional electron gas used as a channel in the HEMT. Furthermore, the region in which the 2-dimensional electron gas carriers are present is referred to as the "carrier region."

As described above, the 2-dimensional electron gas carriers occur in the GaN layer 10 due to the lattice constant difference between layers. Therefore, a lateral leak path is formed at the interface between the AlN layer 12 and the GaN layer 10, and the leak current is increased. In this embodiment of the present invention, the nitride semiconductor layer having the largest lattice constant among a plurality of nitride semiconductor layers included in the composite layer of the buffer layer 400 is simultaneously doped with carbon atoms and oxygen atoms, thereby compensating the 2-dimensional electron gas carriers. These atoms used for doping are doped in at least a portion of the carrier region in which the 2-dimensional electron gas carriers occur. The following describes the generation of a 2-dimensional electron gas level in the buffer layer 400 and a simulation for verifying the compensation effect caused by impurity atoms.

Figure 2:
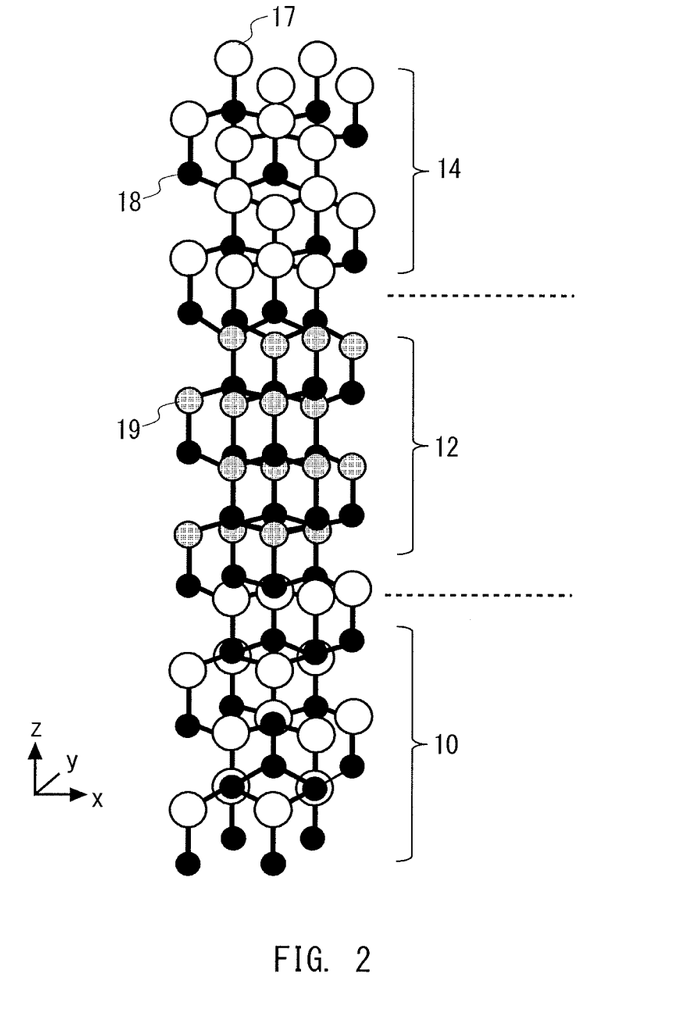
FIG. 2 shows an atomic model of the GaN/AlN/GaN layered structure used in the simulation.

FIG. 2 shows an atomic model of the GaN/AlN/GaN layered structure used in the simulation. The atomic model includes a super cell formed by the GaN layer 10 having two layers of structural units, the AlN layer 12 having two layers of structural units, and the GaN layer 14 having two layers of structural units. The thickness of the GaN layer 10 is approximately 1 nm, the thickness of the AlN layer 12 is approximately 1 nm, and the thickness of the GaN layer 14 is approximately 1 nm. The atomic model of FIG. 2 is formed by gallium atoms 17, nitrogen atoms 18, and aluminum atoms 19, and includes a total of 96 atoms. The simulation was performed by calculating the first-principles electron state for the 96 atoms, based on a local density approximation. The effect of the doped impurities was verified by suitably exchanging gallium atoms 17 or nitrogen atoms 18 for carbon atoms or oxygen atoms.

In the simulation, Advance/PHASE was used. Furthermore, the calculation was performed using a Vanderbilt ultrasoft pseudopotential. The exchange interaction was calculated in a range of the generalized gradient approximation. The calculation of the electron density distribution was performed under the following conditions with consideration to the electron spin. The cutoff energy was 25 Ry and 230 Ry respectively for the wave function and the charge density distribution. Here, the sampled k points were 3×3×2, and the calculated number of bands was 280. First, the results of the simulation when the electron model shown in FIG. 2 does not include impurities are described.

Figure 3:
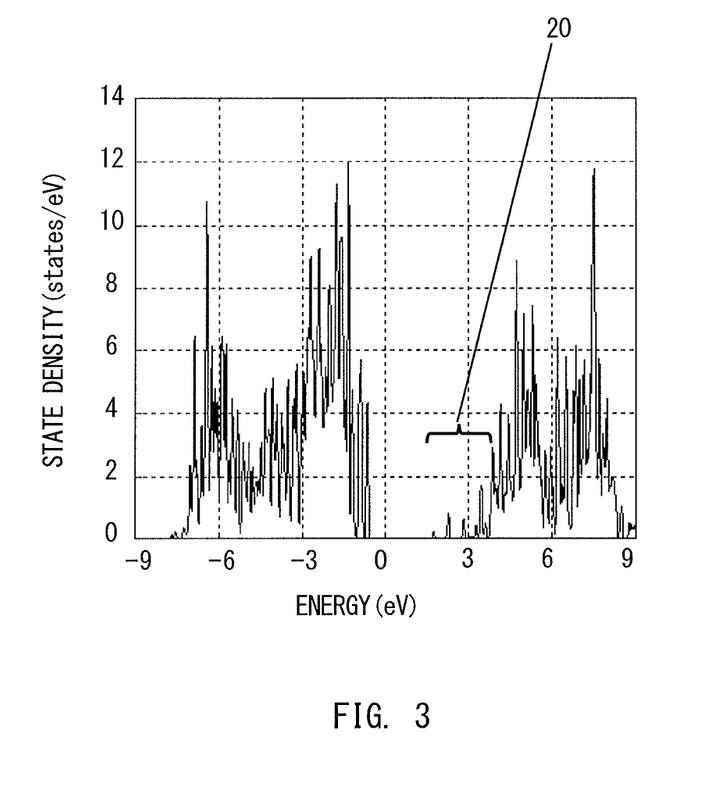
FIG. 3 is a graph showing the relationship between energy and state density in the upper portion of the GaN layer when impurities are not included.

FIG. 3 is a graph showing the relationship between energy and state density in the upper portion of the GaN layer 10 when impurities are not included. The vertical axis indicates the sum of the layer-divided local electron density in the upper portion of the GaN layer 10 directly below the AlN layer 12. The horizontal axis represents the energy when the Fermi level is set to 0 eV. From this graph, it can be seen that there is a shallow donor level 20 around an energy value of approximately 2 eV to approximately 3 eV, i.e. approximately 0 eV to approximately 1 eV below the conduction band. This shallow donor level 20 is formed by the piezoelectric polarization caused by the difference in lattice constants between AlN and GaN, and functions as a 2-dimensional gas level.

The simulation shown in FIG. 3 does not include doping impurities at a temperature of absolute zero, and therefore there are no carriers. Accordingly, the shallow donor level 20 is empty. When the temperature is raised and impurities are doped to provide carriers, carrier electrons 15 are trapped in the shallow donor level 20. As a result, the Fermi level $E_F$ rises and the carrier electrons 15 trapped in the shallow donor level 20 behave as 2-dimensional electron gas. Generally, the carriers behaving as the 2-dimensional electron gas are believed to be at a location that is approximately 10 nm in a direction toward the substrate from the surface of the GaN layer 10 directly below the AlN layer 12. These carriers act as a leak current source of the buffer layer. The total number (density) of the shallow donor level 20 is converted into a sheet carrier density of $5.6 \times 10^{13}$ cm$^{-2}$. The following describes the results of the simulation when impurities are doped in the atomic model system shown in FIG. 2.

Figure 4:
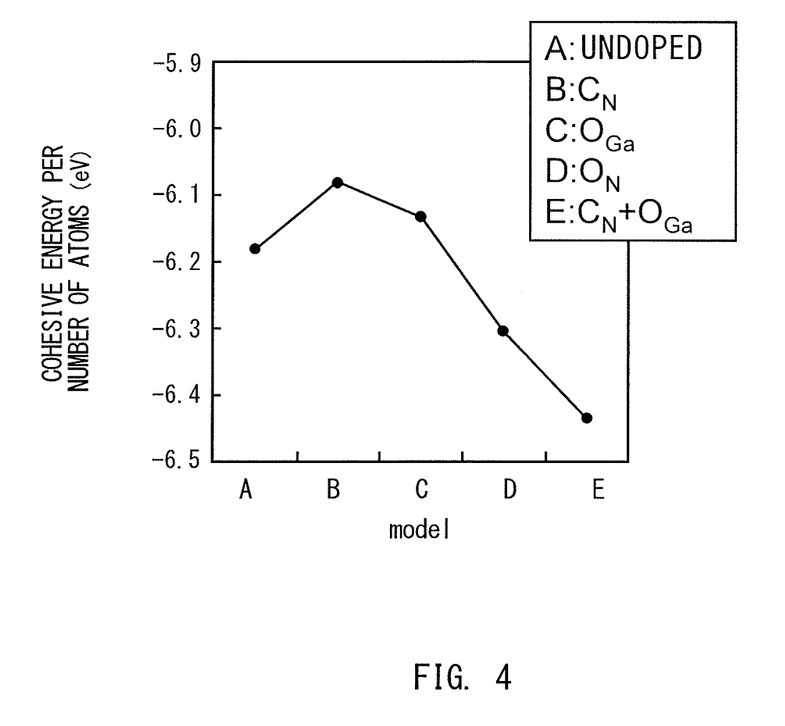
FIG. 4 is a graph showing the relationship between the type of impurities and the cohesive energy of the system of the atomic model shown in FIG. 2.

FIG. 4 is a graph showing the relationship between the type of impurities and the cohesive energy of the system of the atomic model shown in FIG. 2. The vertical axis indicates the sum of the cohesive energy of the 96 atoms in the atomic model shown in FIG. 2. The horizontal axis indicates a model of the doped impurities. Model A indicates a case in which impurity atoms are not doped. Model B indicates a case in which the carrier region in the upper portion of the GaN layer 10 directly below the AlN layer 12 is doped with carbon, and the carbon atoms are exchanged with the nitrogen atoms. In this case, the doped carbon functions as acceptor atoms, and forms an acceptor level.

Model C indicates a case in which the carrier region in the upper portion of the GaN layer 10 directly below the AlN layer 12 is doped with oxygen, and the oxygen atoms are exchanged with the gallium atoms. In this case, the doped oxygen functions as acceptor atoms, and forms an acceptor level. Model D indicates a case in which the carrier region in the upper portion of the GaN layer 10 directly below the AlN layer 12 is doped with oxygen, and the oxygen atoms are exchanged with the nitrogen atoms. In this case, the doped oxygen functions as donor atoms, and forms a donor level. Model E indicates a case in which the carrier region in the upper portion of the GaN layer 10 directly below the AlN layer 12 is simultaneously doped with carbon and oxygen, the carbon atoms are exchanged with the nitrogen atoms, and the oxygen atoms are exchanged with the gallium atoms. In this case, the doped carbon atoms and oxygen atoms function as acceptor atoms, and form an acceptor level.

Based on the graph of FIG. 4, compared to Model A, Models B and C have higher cohesive energy. Model B shows that, when doped only with carbon, the system is less stable than when doping is not performed. In other words, the acceptor level is formed by exchanging the nitrogen sites with carbon, but this increases the cohesive energy of the system and it is therefore difficult to dope with a high density of carbon. Accordingly, it is difficult to sufficiently compensate the 2-dimensional gas level by doping only with carbon.

Concerning Model C, when doping is performed only with oxygen to replace the gallium sites, the system is less stable than when doping is not performed. Accordingly, the acceptor level is formed by exchanging the gallium sites with oxygen, but this causes the cohesive energy of the system to be higher than when doping is not performed, and it is therefore difficult to dope with a high density of oxygen.

On the other hand, compared to Model A, Models D and E have lower cohesive energy. Model D results in a system that is more stable than Model A when the nitrogen sites are replaced with oxygen. However, it should be noted that the oxygen that replaces the nitrogen sites forms a donor level. In other words, carriers are provided to the 2-dimensional electron gas level, and therefore the 2-dimensional electron gas level cannot be compensated.

In contrast to this, Model E has low cohesive energy and results in a system having the most stable state by simultaneously doping with carbon and nitrogen. The reason for this is believed to be as described below.

Aluminum and oxygen bond easily. Furthermore, gallium and carbon bond easily. On the other hand, aluminum and carbon do not bond easily. There is aluminum near the hetero-interface between the AlN layer 12 and the GaN layer 10, and therefore it is difficult for the carbon atoms to enter into the nitrogen sites of the GaN layer. However, since oxygen is present, the oxygen is attracted to the aluminum and can screen the effect of the aluminum. As a result, the carbon easily enters the nitrogen sites. In each model, all of the shallow donor level is compensated.

Figure 5:
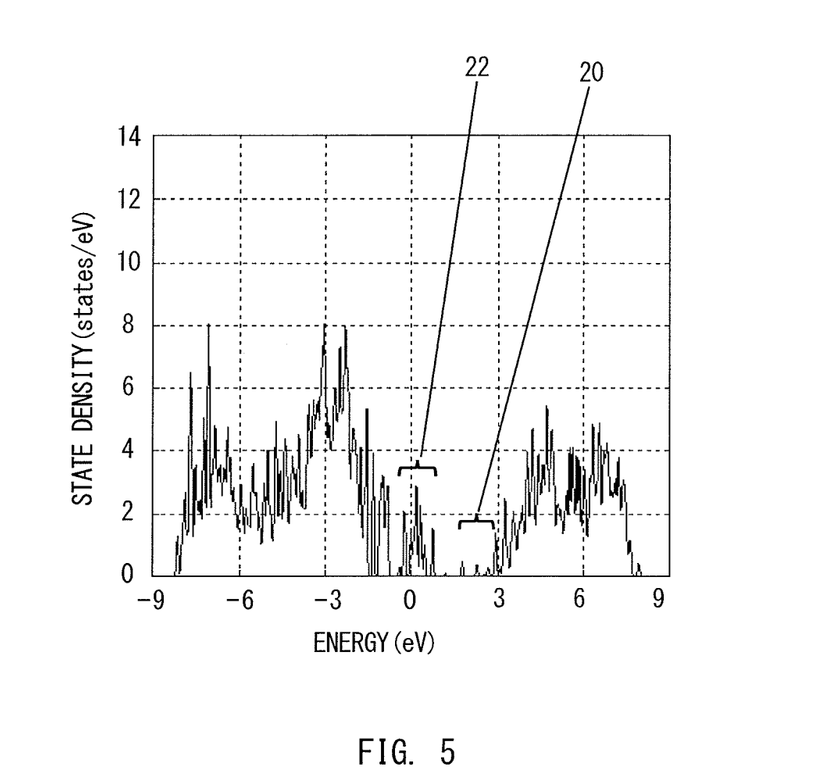
FIG. 5 is a graph showing the relationship between energy and state density in the upper portion of the GaN layer directly below the AlN layer, when doping is performed with carbon and oxygen simultaneously.

FIG. 5 is a graph showing the relationship between energy and state density in the carrier region in the upper portion of the GaN layer 10 directly below the AlN layer 12, when doping is performed with carbon and oxygen simultaneously. The vertical axis shows the sum of the layer-divided local electron density in the carrier region in the upper portion of the GaN layer 10 directly below the AlN layer 12. The horizontal axis indicates the potential energy when the Fermi level is 0 eV. A shallow donor level 20 is formed in a range from approximately 2 eV to approximately 3 eV. Furthermore, an acceptor level 22 caused by the carbon and oxygen is formed in a range from approximately −1 eV to approximately 1 eV. Accordingly, the deeper level or acceptor level formed by the carbon $C_N$ replacing the nitrogen sites and the oxygen $O_{Ga}$ replacing the gallium sites can sufficiently compensate the 2-dimensional electron gas level.

By simultaneously doping with the carbon $C_N$ and the oxygen $O_{Ga}$, in the system of this atomic model, all of the shallow donor level 20 is compensated. Furthermore, although not shown in a drawing, the state density of the shallow acceptor level formed at the hetero-interface of the GaN layer 14 directly above the AlN layer 12 is less than $\frac{1}{30}^{th}$ of the state density in Model A. In other words, the 2-dimensional hole gas level that is formed is also compensated in the same manner as the 2-dimensional electron gas level. Accordingly, the leak current can be decreased.

Here, when the concentration of the oxygen atoms used for doping is higher than the concentration of the carbon atoms, the oxygen replaces the nitrogen sites to form a donor level. Therefore, the 2-dimensional electron gas level cannot be compensated. Accordingly, the density of the carbon atoms used for the doping is preferably higher than the density of the oxygen atoms. Based on the results of the above simulation, it is understood that the system can be stabilized and the 2-dimensional electron gas level and be compensated by simultaneously doping the carrier region in the upper portion of the GaN layer 10 directly below the AlN layer 12 with carbon atoms and oxygen atoms, such that the density of the carbon atoms is greater than the density of the oxygen atoms. As a result, the leak current of the buffer layer 400 can be effectively decreased.

Figure 6:
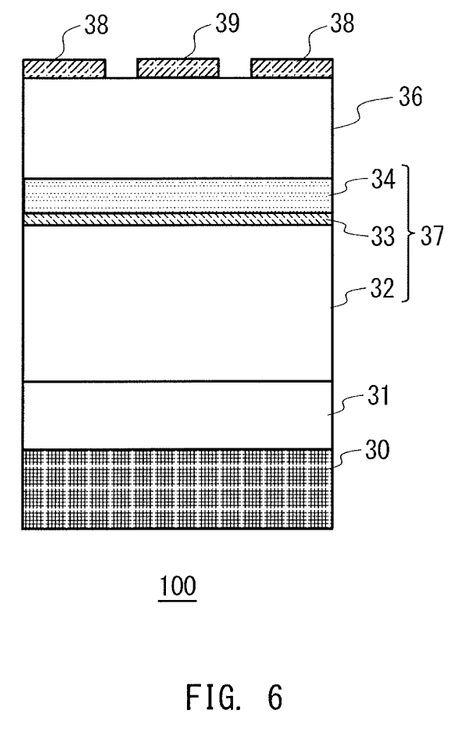
FIG. 6 is a cross-sectional view of an epitaxial substrate according to a first embodiment of the present invention.

FIG. 6 is a cross-sectional view of an epitaxial substrate 100 according to a first embodiment of the present invention. The epitaxial substrate 100 includes a base substrate 30, a seed layer 31, a buffer layer 37, and a GaN layer 36. The base substrate 30 is a sapphire substrate with a thickness of 500 μm and a diameter of 2 inches, for example. The base substrate 30 may be formed by silicon or silicon carbide.

The seed layer 31 is formed on the base substrate 30. The seed layer 31 in this example includes GaN that is epitaxially grown on the base substrate 30. The buffer layer 37 is formed above the base substrate 30. The buffer layer 37 of the present example is formed on the seed layer 31. Here, "above" can refer to an element being above and in contact with or above and not in contact with another element. Furthermore, "on" refers to a state in which an element is above and directly in contact with another element. The buffer layer 37 is epitaxially grown on the seed layer 31.

The buffer layer 37 includes at least one composite layer that contains a plurality of nitride semiconductor layers having different lattice constants. In the present example, the buffer layer 37 includes one composite layer. The buffer layer 37 of the present example includes a GaN layer 32 and an AlN layer 34. The buffer layer 37 decreases the dislocation density and warping of the epitaxial substrate 100, which is caused by a difference in thermal expansion coefficients and a difference in the lattice constants between the base substrate 30 and the GaN layer 36 epitaxially grown above the base substrate 30. The thickness of the GaN layer 32 is 1.4 μm, for example. The thickness of the AlN layer 34 is 20 nm, for example. The GaN layer 36 functions as the topmost layer of the buffer layer. The GaN layer 36 has a thickness of 1 μm, for example. The buffer layer 37 may be formed by repeatedly layering a composite layer that is formed by epitaxially growing a GaN layer 32 and an AlN layer 34 in the stated order.

In at least one composite layer in the buffer layer 37, the carrier region 33 of the nitride semiconductor layer having the largest lattice constant, which is the GaN layer 32, from among the plurality of nitride semiconductor layers, i.e. the GaN layer 32 and the AlN layer 34, is doped with carbon atoms and oxygen atoms. The carbon atoms and the oxygen atoms are doped in at least a portion of the carrier region 33, and are preferably doped in the entire carrier region 33. The carrier region 33 refers to a region in the nitride semiconductor layer with the largest lattice constant, i.e. the GaN layer 32, in which the 2-dimensional electron gas carriers are generated by the lattice constant difference with respect to the nitride semiconductor layer directly thereabove, i.e. the AlN layer 34. Specifically, the doped region doped with carbon atoms and oxygen atoms is formed from the surface of the GaN layer 32 to a prescribed depth. The depth of the doped region may be 10 nm or more. However, it should be noted that when the depth of the doped region is 100 nm or more, the dislocation density increases. Accordingly, the depth of the doped region is preferably no less than 10 nm and no greater than 100 nm. The GaN layer 32 may include an undoped region that is not doped with carbon atoms or oxygen atoms, in a region other than the carrier region 33. The undoped region is positioned closer to the base substrate 30 than the carrier region 33. In other words, the GaN layer 32 is thicker than the doped region.

The doping concentration of the carbon atoms may be from $1 \times 10^{18}$ cm$^{-3}$ to $5 \times 10^{19}$ cm$^{-3}$, for example. If the doping concentration of the carbon atoms is greater than $5 \times 10^{19}$ cm$^{-3}$, the crystal quality of the surface of the GaN layer 32 is degraded. When the carbon atoms are doped with high concentration, cracks occur in the base substrate 30. The doping concentration of the oxygen atoms may be from $1 \times 10^{18}$ cm$^{-3}$ to $5 \times 10^{19}$ cm$^{-3}$, for example. The carbon atoms and the oxygen atoms are intentionally doped. Intentional doping refers to doping with the carbon atoms and oxygen atoms at a prescribed concentration set according to design.

The doping concentration of the carbon atoms in the doped region is greater than the doping concentration of the oxygen atoms in the doped region. When the concentration of the doped oxygen atoms is greater than the concentration of the doped carbon atoms, the oxygen atoms replace the nitrogen sites and form a donor level. Therefore, the 2-dimensional electron gas level cannot be sufficiently compensated, and so the leak current cannot be sufficiently restricted. Accordingly, the concentration of the doped carbon atoms is preferably greater than the concentration of the doped oxygen atoms. For example, the carbon concentration may be from $1 \times 10^{19}$ cm$^{-3}$ and the oxygen concentration may be $5 \times 10^{18}$ cm$^{-3}$. In order to check the leak current characteristic of the epitaxial substrate 100, electrodes 38 and 39 are formed on the GaN layer 36.

Figure 7:
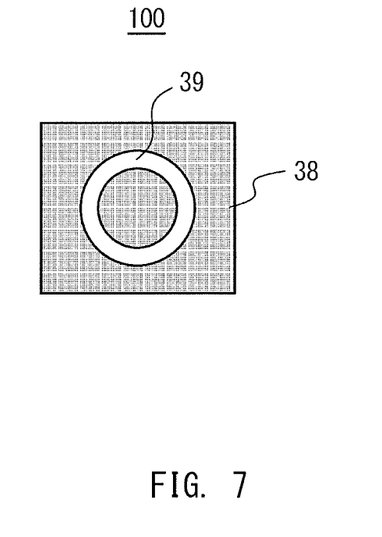
FIG. 7 is a planar view of the epitaxial substrate on which the electrodes are formed.

FIG. 7 is a planar view of the epitaxial substrate 100 on which the electrodes 38 and 39 are formed. The electrode 39 of the present example is circular and has a diameter of approximately 160 μm. The electrode 38 of the present example surrounds the electrode 39 and is distance by 30 μm in the radial direction from the electrode 39.

Figure 8:
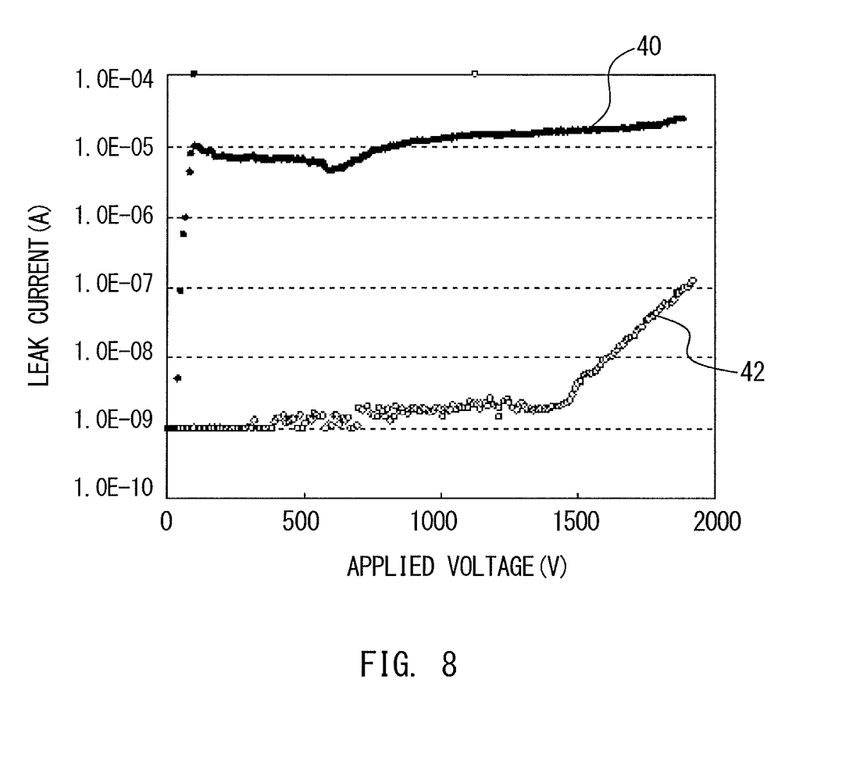
FIG. 8 is a graph obtained by measuring the leak current characteristic of the epitaxial substrate.

FIG. 8 is a graph obtained by measuring the leak current characteristic of the epitaxial substrate 100. The vertical axis indicates the leak current flowing between the electrodes 38 and 39, and the horizontal axis indicates the voltage applied between the electrodes 38 and 39. The leak current characteristic was measured using a curve tracer. The curve 40 indicates the leak current when the carrier region 33 is not doped with impurities. The curve 42 indicates the leak current when the carrier region 33 is doped with impurities. In the curve 40, the leak current increases suddenly as the applied voltage is increased from 0 V to 100 V, and the leak current after this increase is approximately 1E-5 A. Furthermore, in the curve 40, the leak current gradually increases as the applied voltage is increased from approximately 600 V. In contrast, in the epitaxial substrate 100 corresponding to the curve 42, the leak current in the applied voltage range of 0 V to 1500 V is substantially constant at approximately 1E-9 A, which is four orders of magnitude lower than the comparative example.

Based on these results, it is understood that the 2-dimensional electron gas level formed in the carrier region 33 of the GaN layer 32 directly under the AlN layer 34 can be compensated by simultaneously doping with carbon atoms and oxygen atoms, with the doping concentration of the carbon atoms being higher than the doping concentration of the oxygen atoms. Accordingly, with the present example, an epitaxial substrate 100 can be provided that has high breakdown voltage and in which the leak current is sufficiently restricted. When the doping is performed using only oxygen atoms, no significant decrease in the leak current relative to the curve 40 was observed. Furthermore, when the doping is performed using only carbon atoms, in order to obtain the same leak current reduction effect as shown by the curve 42, it is necessary to use a carbon atom doping concentration that is at least three times that of the present example, and this results in degradation of the crystal quality and increase of the dislocation density.

The following describes a method for manufacturing the epitaxial substrate 100. The epitaxial substrate 100 manufacturing method includes preparing the base substrate 30, epitaxially growing the seed layer 31 on the base substrate 30, and forming the buffer layer 37 on the seed layer 31. The base substrate 30 may be a sapphire substrate with a thickness of 500 μm and a diameter of 2 inches, for example. In the present example, the epitaxial growth is performed using MOCVD. The epitaxial growth of the seed layer 31 includes epitaxially growing GaN. The epitaxial growth of the GaN is performed in a reaction chamber by introducing trimethylgallium (TMGa) and ammonia (NH$_3$) at respective flow rates of 14 μmol/min and 12 L/min, setting the growth temperature to 550° C., and achieving a thickness of 30 nm.

Forming the buffer layer 37 includes layering at least one composite layer that includes a plurality of nitride semiconductor layers with different lattice constants. Layering the composite layer includes simultaneously doping the carrier region of the nitride semiconductor layer having the largest lattice constant among the plurality of nitride semiconductor layers in the composite layer, or in at least one composite layer if there are more than one composite layers, simultaneously with a predetermined concentration of carbon atoms and a predetermined concentration of oxygen atoms. The composite layer includes a GaN layer and an Al$_X$GA$_{(1-X)}$ layer, where $0<X\leq 1$. In this example, the composite layer may include the GaN layer 32 and the AlN layer 34.

Layering the composite layer includes epitaxially growing the GaN layer 32 on the seed layer 31, doping the carrier region 33 of the GaN layer 32 simultaneously with carbon atoms and oxygen atoms, and epitaxially growing the AlN layer 34 on the GaN layer 32. The epitaxial growth of the GaN layer 32 may be performed by introducing TMGa and NH$_3$ at respective flow rates of 58 μmol/min and 12 L/min, setting the growth temperature to 1050° C., setting the growth pressure to 50 Torr, and achieving a thickness of 1.4 μm. The carrier region 33 of the GaN layer 32 includes at least the region in which the 2-dimensional electron gas is formed. Specifically, the carrier region 33 of the GaN layer 32 may be a region in a range of no less than 10 nm and no more than 100 nm deep from the surface of the GaN layer 32.

Doping the carrier region 33 of the GaN layer 32 simultaneously with carbon atoms and oxygen atoms includes, at a time the epitaxial growth of the GaN layer 32 has progressed to a point where 50 nm of growth remain, simultaneously introducing a hydrocarbon gas, such as propane gas, and a hydrogen gas or nitrogen gas obtained by diluting an oxygen gas, for example. During the simultaneous doping, the concentration of the doped carbon atoms is higher than the concentration of the doped oxygen atoms. For example, the flow rate of the propane gas may be adjusted such the carbon concentration is $1 \times 10^{19}$ cm$^{-3}$. Furthermore, the flow rate of the nitrogen gas may be adjusted such the oxygen concentration is $5 \times 10^{18}$ cm$^{-3}$. The epitaxial growth of the AlN layer 34 is performed by introducing trimethylaluminum (TMAl) and NH₃ at respective flow rates of 95 μmol/min and 12 L/min, and achieving a thickness of 20 nm.

Forming the buffer layer 37 further includes epitaxially growing the GaN layer 36 on the AlN layer 34. The epitaxial growth of the GaN layer 36 is performed by introducing TMGa and NH₃ at respective flow rates of 19 μmol/min and 12 L/min, setting the growth temperature to 1050° C., setting the growth pressure to 200 Torr, and achieving a thickness of 1 μm. In order to check the leak current characteristic of the epitaxial substrate 100, two electrodes 38 and 39 are formed on the top of the GaN layer 36. The electrodes 38 and 39 are each formed by depositing Ti with a thickness of 20 nm and Al with a thickness of 300 nm in the stated order, via sputtering deposition, and then using the lift-off technique.

As shown in FIG. 8, the epitaxial substrate 100 manufactured using the above method can restrict the leak current to be four orders of magnitude less than in the comparative example in which doping with impurities is not performed. Accordingly, the 2-dimensional electron gas level can be compensated by simultaneously doping with carbon and oxygen, and 2-dimensional electron gas carriers are substantially absent from the buffer layer 37. Furthermore, the leak current restriction effect is maintained up to an applied voltage of 1500 V. Therefore, the epitaxial substrate 100 has a high breakdown voltage of 1500 V.

Figure 9:
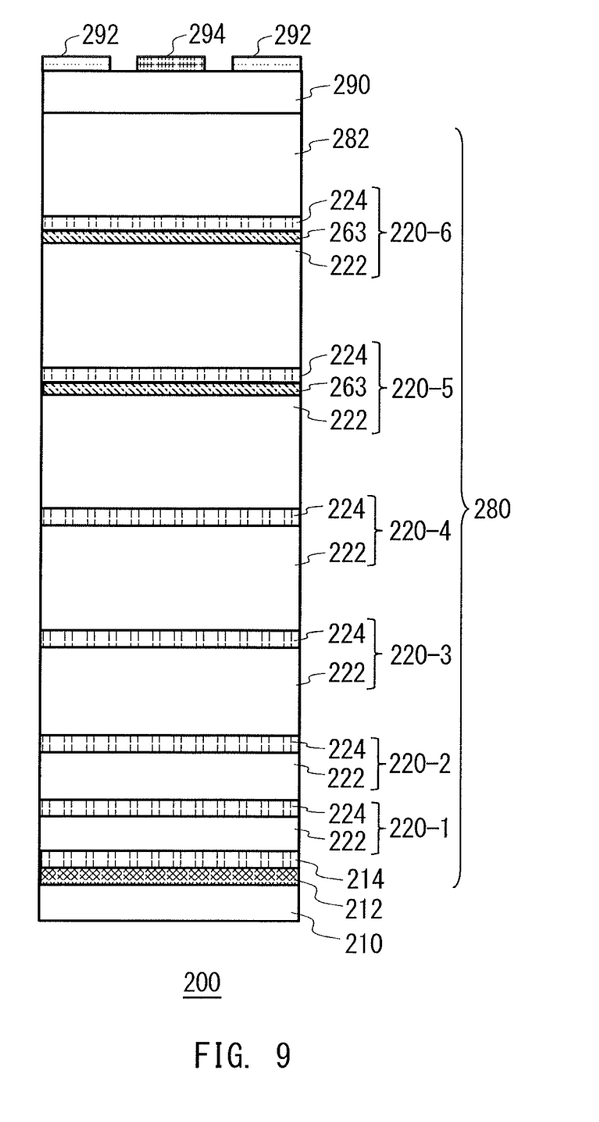
FIG. 9 is a cross-sectional view of a nitride semiconductor device according to a second aspect of the present invention.

FIG. 9 is a cross-sectional view of a nitride semiconductor device 200 according to a second embodiment of the present invention. The nitride semiconductor device 200 includes a base substrate 210, an intermediate layer 212, a buffer layer 280, a channel layer 290, an electrode 292, and an electrode 294. The base substrate 210 is the same as the base substrate 30. The base substrate 210 of the present example is a silicon substrate with surface orientation (111).

The intermediate layer 212 is epitaxially grown on the base substrate 210. The intermediate layer 212 in the present example is SiN. The intermediate layer 212 prevents chemical reactions between the base substrate 210 and the buffer layer 280 formed on the base substrate 210.

The buffer layer 280 is formed above the base substrate 210. The buffer layer 280 in the present example is formed on the intermediate layer 212. The buffer layer 280 in the present example includes an AlN layer 214, a plurality of composite layers 220-1, 220-2, 220-3, 220-4, 220-5, and 220-6, and a GaN layer 282. The AlN layer 214 is formed on the intermediate layer 212. The AlN layer 214 functions as the bottommost layer of the buffer layer. The thickness of the AlN layer 214 is 40 nm, for example.

The buffer layer 280 of the present example includes six composite layers 220 in series. Each composite layer 220 includes a GaN layer and an $Al_XGa_{(1-X)}$ layer, where $0<X\leq1$. The composite layers 220 of the present example are formed by sequentially layering GaN layers 222 and AlN layers 224 from the base substrate 210. The GaN layers 222 and AlN layers 224 correspond to the GaN layer 32 and the AlN layer 34.

The thickness of the AlN layer 224 in each composite layer 220 is 50 nm, for example. The thickness of the GaN layer 222 in the first composite layer 220-1 is 290 nm, for example. The thickness of the GaN layer 222 in the second composite layer 220-2 is 330 nm, for example. The thickness of the GaN layer 222 in the third composite layer 220-3 is 390 nm, for example. The thickness of the GaN layer 222 in the fourth composite layer 220-4 is 470 nm, for example. The thickness of the GaN layer 222 in the fifth composite layer 220-5 is 580 nm, for example. The thickness of the GaN layer 222 in the sixth composite layer 220-6 is 740 nm, for example.

A doped region 263 is formed in the GaN layer 222 of at least one of the composite layers 220. The doped region 263 may be formed in the entire carrier region in the upper portion of the GaN layer 222. The doped region 263 may be formed in all of the GaN layers 222, or may be formed in a prescribed number of GaN layers 222 nearest the channel layer 290. In the buffer layer 280 of the present example, the doped region 263 is formed in the sixth composite layer 220-6 and the fifth composite layer 220-5. The doped region 263 corresponds to the doped region described in relation to FIG. 6.

The GaN layer 282 is formed on the AlN layer 224 of the sixth composite layer 220-6. The GaN layer 282 functions as the topmost layer of the buffer layer 280. The channel layer 290 is epitaxially grown on the GaN layer 282. The channel layer 290 of the present example includes an n-type GaN layer. In the channel layer 290, GaN serving as the donor atoms are doped with Si, such that the electrons form a multicarrier electron channel layer.

At least two electrodes are formed above the channel layer 290. In the present example, the electrodes 292 and 294 are formed on the channel layer 290. One of the electrodes 292 and 294 is formed of a material that realizes Schottky contact with the channel layer 290, and the other electrode is formed of a material that realizes ohmic contact. The nitride semiconductor device 200 of the present example operates as a Schottky barrier diode. According to the configuration of an insulating film and electrodes formed above the channel layer 290, for example, the nitride semiconductor device 200 can operate as a variety of elements.

The following describes the method for manufacturing the nitride semiconductor device 200. The nitride semiconductor device 200 manufacturing method includes preparing the base substrate 210, epitaxially growing the intermediate layer 212 on the base substrate 210, forming the buffer layer 280 above the base substrate 210, forming the channel layer 290 on the buffer layer 280, and forming at least two electrodes (292 and 294) above the channel layer 290. The base substrate 210 may be a silicon substrate with a diameter of 4 inches and a thickness of 1 mm, formed using the CZ (Czochralski) process. The Si crystal surface orientation of the silicon substrate may be (111). The base substrate 210 may be formed of sapphire or silicon carbide. In the present example, the epitaxial growth is performed using MOCVD.

The epitaxial growth of the intermediate layer 212 is performed by introducing NH₃ at a flow rate of 35 L/min for 0.3 minutes, at a growth temperature of 1000° C. Forming the buffer layer 280 includes epitaxially growing the AlN layer 214 on the intermediate layer 212. The epitaxial growth of the AlN layer 214 is performed by introducing TMAl and NH₃ at respective flow rates of 175 μmol/min and 35 L/min at a growth temperature of 1000° C., and achieving a thickness of 40 nm.

Forming the buffer layer 280 includes layering at least one composite layer 220 that includes a plurality of nitride semiconductor layers having different lattice constants. Layering the composite layer 220 includes alternately layering a GaN layer 222 and an AlN layer 224 six times. The condition for layering each composite layer 220 may be the same as the condition for layering the composite layer in the epitaxial substrate 100. By adjusting the growth time of the GaN layers 222, the thickness of the GaN layer 222 in each of the six stages of composite layers may be controlled to become gradually thicker in a direction from the bottom toward the top.

Forming the buffer layer 280 includes epitaxially growing the GaN layer 282 on the topmost surface of the composite layer. The epitaxial growth of the GaN layer 282 is performed by introducing TMGa and NH$_3$ at respective flow rates of 58 µmol/min and 12 L/min, setting the growth temperature to 1050° C., setting the growth pressure to 50 Torr, and achieving a thickness of 200 nm Forming the channel layer 290 above the buffer layer 280 includes epitaxially growing an n-type GaN layer by introducing TMGa and NH$_3$ at respective flow rates of 19 µmol/min and 12 L/min, simultaneously adding silane gas (SiH$_4$), setting the growth temperature to 1050° C., setting the growth pressure to 200 Torr, and achieving a thickness of 500 nm. The flow rate of the silane gas is adjusted such that the electron carrier concentration is $2 \times 10^{16}$ cm$^{-3}$, for example, and Si is then doped as the donor atom. With this carrier concentration, the nitride semiconductor device 200 has a designed breakdown voltage of 700 V.

Forming the at least two electrodes (292 and 294) on the channel layer 290 includes forming an electrode pattern on the channel layer 290 using photolithography, depositing metal via sputtering, and forming the electrodes using the lift-off technique. The anode electrode 294 may be formed by forming a resist pattern with a circular opening having a diameter of approximately 160 µm, for example, in the substantial center of the surface of the nitride semiconductor device 200, sputtering Ni and Au in the stated order, and lifting off the resist. The cathode electrode 292 may be formed by forming a circular resist pattern with a diameter of approximately 180 µm, in a case where the electrode interval is 10 µm, in the central region of the surface of the nitride semiconductor device 200, sputtering Ti and Al in the stated order, and lifting off the resist. After forming the cathode electrode 292, thermal processing may be performed at 700° C. for 30 minutes, for example. As a result of the thermal processing, favorable ohmic characteristics can be realized between the channel layer 290 and the cathode electrode 292.

The nitride semiconductor device 200 manufactured according to the above method can provide a Schottky barrier diode with higher OFF resistance and lower leak current than in conventional devices in which the buffer layers are not doped with impurities. In the present example, impurities were added to the fifth composite layer 220-5 and the sixth composite layer 220-6 in the buffer layer 280, but impurities may be added to any of the composite layers. Furthermore, the number of composite layers to which impurities are added is not limited to two, and the effect of reducing the leak current can be achieved to varying degrees by adding impurities to at least one of the composite layers.

Figure 10:
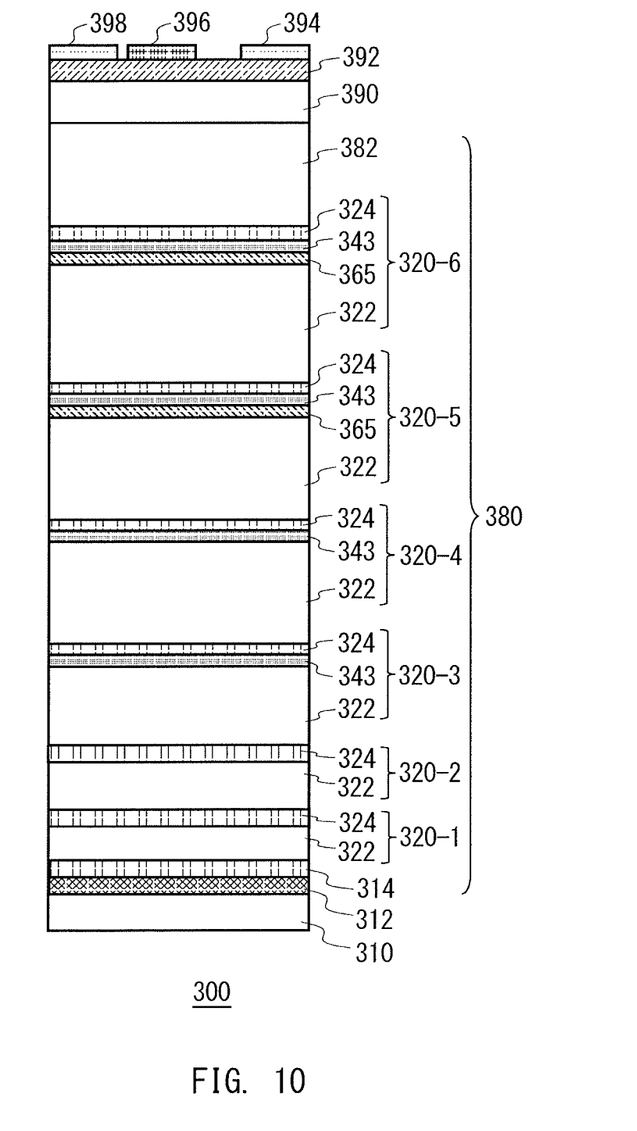
FIG. 10 is a cross-sectional view of a nitride semiconductor device according to a third embodiment of the present invention.

FIG. 10 is a cross-sectional view of a nitride semiconductor device 300 according to a third embodiment of the present invention. The nitride semiconductor device 300 includes a base substrate 310, an intermediate layer 312, a buffer layer 380, a channel layer 390, an electron supply layer 392, an electrode 394, an electrode 396, and an electrode 398. The base substrate 310 and the intermediate layer 312 are the same as the base substrate 210 and the intermediate layer 212.

The buffer layer 380 includes an AlN layer 314, a plurality of composite layers 320-1, 320-2, 320-3, 320-4, 320-5, and 320-6, and a GaN layer 382. The AlN layer 314 and the GaN layer 382 are the same as the AlN layer 214 and the GaN layer 282. Each composite layer 320 includes a GaN layer 322 and an AlN layer 324. The GaN layers 322 and the AlN layers 324 are the same as the GaN layers 222 and the AlN layers 224.

The buffer layer 380 differs from the buffer layer 280 because, in the buffer layer 380, at least one of the composite layers 320 further includes an AlGaN layer 343 in addition to the GaN layer 322 and the AlN layer 324. In the buffer layer 380, a prescribed number of composite layers 320 from the channel layer 390 side include AlGaN layers 343. In the present example, the sixth composite layer 320-6 and the fifth composite layer 320-5 include AlGaN layers 343. Each AlGaN layer 343 is provided between the corresponding AlN layer 324 and GaN layer 322, and may be an Al$_X$Ga$_{(1-X)}$N layer in which the Al composition changes continuously or in stages, where 0<X<1.

The thickness of the AlN layer 324 in each composite layer 320 is 50 nm, for example. The thickness of the GaN layer 322 in the first composite layer 320-1 is 290 nm, for example. The thickness of the GaN layer 322 in the second composite layer 320-2 is 330 nm, for example. The thicknesses of the GaN layer 322 and the AlGaN layer 343 in the third composite layer 320-3 are respectively 390 nm and 50 nm, for example. The thicknesses of the GaN layer 322 and the AlGaN layer 343 in the fourth composite layer 320-4 are respectively 450 nm and 40 nm, for example. The thicknesses of the GaN layer 322 and the AlGaN layer 343 in the fifth composite layer 320-5 are respectively 560 nm and 40 nm, for example. The thicknesses of the GaN layer 322 and the AlGaN layer 343 in the sixth composite layer 320-6 are respectively 720 nm and 40 nm, for example.

In the present example, the doped region 365 is formed in the GaN layer 322 of at least one composite layer 320. The doped region 365 may be formed in the entire carrier region in the top portion of the GaN layer 322. In the present example, the doped region 365 is formed in the sixth composite layer 320-6 and the fifth composite layer 320-5. The doped region 365 corresponds to the doped region described in relation to FIG. 6.

Furthermore, all of the composite layers 320 may include an AlGaN layer 343 between the GaN layer 322 and the AlN layer 324. The thicknesses of the GaN layers 322 in the composite layers 320 may gradually increase in a direction from the base substrate 310 toward the channel layer 390. By forming the buffer layer 380 in the above manner, the dislocation density is decreased and warping of the substrate is restricted, thereby enabling a nitride semiconductor device 300 to be provided having high breakdown voltage and thicker layers of epitaxial growth.

The electron supply layer 392 may be an Al$_X$Ga$_{(1-X)}$N layer with a thickness of 30 nm epitaxially grown on the channel layer 390. The electron supply layer 392 may be an Al$_{0.22}$Ga$_{0.78}$N layer in which the aluminum composition X=0.22. The lattice constant difference between the channel layer 390 and the electron supply layer 392 causes a piezoelectric field at the hetero-interface. The piezoelectric field generates 2-dimensional electron gas in a region up to a depth of approximately 2 nm from the surface of the channel layer 390.

At least two electrodes are formed above the channel layer 390. In the present example, a source electrode 394, a gate electrode 396, and a drain electrode 398 are formed on the electron supply layer 392. The source electrode 394 and the drain electrode 398 may be ohmic electrodes that realize ohmic contact with the electron supply layer 392. The gate electrode 396 may be a Schottky electrode that realizes Schottky contact with the electron supply layer 392. The gate electrode 396 may have a gate length of 2 µm and a gate width of 0.2 mm. The source-drain distance may be 15 µm, and the gate-drain distance may be 10 µm. The nitride semiconductor device 300 has a breakdown voltage of 1000 V or more, and operates as a field effect transistor that can effectively reduce the leak current. When manufacturing the nitride semiconductor device 300, the carrier region in the GaN layer 322 directly below the AlGaN layer 343 is simultaneously doped with oxygen atoms and carbon atoms.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A nitride semiconductor device comprising:
a base substrate;
a buffer layer formed above the base substrate;
an active layer formed on the buffer layer; and
at least two electrodes formed above the active layer, wherein
the buffer layer includes one or more composite layers that each have a GaN layer and an $Al_xGa_{(1-x)}N$ layer formed on the GaN layer, where $0<X\leq1$, and
the GaN layer in the buffer layer is doped with carbon atoms and oxygen atoms in at least a portion of a carrier region of the GaN layer, the carrier region being a region in which carriers are generated due to the difference in lattice constants between the GaN layer and the $Al_xGa_{(1-x)}N$ layer formed directly thereon.

2. The nitride semiconductor device according to claim 1, wherein
the GaN layer doped with the carbon atoms and the oxygen atoms includes an undoped region that is different from the carrier region and is not doped with carbon atoms or oxygen atoms.

3. The nitride semiconductor device according to claim 2, wherein
the undoped region is positioned closer to the base substrate than the carrier region.

4. The nitride semiconductor device according to claim 1, wherein
concentration of the carbon atoms in the GaN layer is higher than concentration of the oxygen atoms.

5. The nitride semiconductor device according to claim 1, wherein
the GaN layer doped with the carbon atoms and the oxygen atoms substantially does not contain carriers caused by a lattice constant difference with respect to the nitride semiconductor layer formed directly thereon.

6. The nitride semiconductor device according to claim 1, wherein
the base substrate includes silicon, sapphire, or silicon carbide.

7. The nitride semiconductor device according to claim 1, wherein
the nitride semiconductor device is a diode or a field effect transistor.

8. The nitride semiconductor device according to claim 1, wherein
the nitride semiconductor layer is doped simultaneously with the carbon atoms and the oxygen atoms.

9. The nitride semiconductor device according to claim 1, wherein
the doping concentration of the oxygen atoms is from $1\times10^{18}$ cm$^{-3}$ to $5\times10^{19}$ cm$^{-3}$.

10. A nitride semiconductor device comprising:
a base substrate;
a buffer layer formed above the base substrate;
an active layer formed on the buffer layer; and
at least two electrodes formed above the active layer, wherein
the buffer layer comprises an AlN layer sandwiched between two GaN layers, and
one of the GaN layers is doped with carbon atoms and oxygen atoms.

11. The nitride semiconductor device according to claim 10, wherein
the GaN layer doped with the carbon atoms and the oxygen atoms includes an undoped region that is not doped with carbon atoms or oxygen atoms.

12. The nitride semiconductor device according to claim 10 wherein the GaN layer doped with the carbon atoms and oxygen atoms is doped with carbon atoms and oxygen atoms in at least a portion of a carrier region, the carrier region being a region in which carriers are generated due to a difference in lattice constants between the GaN layer and the AlN layer.

13. The nitride semiconductor device according to claim 10, wherein
the GaN layer doped with the carbon atoms and the oxygen atoms substantially does not contain carriers caused by a lattice constant difference with respect to the AlN layer.

* * * * *